(12) United States Patent
Ohmi et al.

(10) Patent No.: US 8,679,640 B2
(45) Date of Patent: Mar. 25, 2014

(54) AL ALLOY MEMBER, ELECTRONIC DEVICE MANUFACTURING APPARATUS, AND METHOD OF MANUFACTURING AN ANODIC OXIDE FILM COATED AL ALLOY MEMBER

(75) Inventors: Tadahiro Ohmi, Sendai (JP); Masafumi Kitano, Sendai (JP); Minoru Tahara, Sendai (JP); Hisakazu Ito, Shizuoka (JP); Kota Shirai, Shizuoka (JP); Masayuki Saeki, Tokyo (JP)

(73) Assignees: National University Corporation Tohoku University, Miyagi (JP); Nippon Light Metal Company, Ltd., Tokyo (JP)

( * ) Notice: Subject to any disclaimer, the term of this patent is extended or adjusted under 35 U.S.C. 154(b) by 104 days.

(21) Appl. No.: 13/055,582

(22) PCT Filed: Jul. 28, 2009

(86) PCT No.: PCT/JP2009/063415
§ 371 (c)(1),
(2), (4) Date: Jan. 24, 2011

(87) PCT Pub. No.: WO2010/013705
PCT Pub. Date: Feb. 4, 2010

(65) Prior Publication Data
US 2011/0177355 A1   Jul. 21, 2011

(30) Foreign Application Priority Data
Jul. 30, 2008   (JP) ................................ 2008-196036

(51) Int. Cl.
*B32B 1/02*   (2006.01)
*C25D 11/04*   (2006.01)
*C25D 11/06*   (2006.01)
*C22C 21/00*   (2006.01)

(52) U.S. Cl.
USPC ........... 428/544; 205/50; 420/543; 428/472.2

(58) Field of Classification Search
None
See application file for complete search history.

(56) References Cited

U.S. PATENT DOCUMENTS 5,892,278 A * 4/1999 Horita et al. .................. 257/706
6,695,935 B1   2/2004 Haszler et al.
(Continued)

FOREIGN PATENT DOCUMENTS

EP   1880861 A1   1/2008
JP   1272739   10/1989
(Continued)

OTHER PUBLICATIONS

Dickey et al. J. Electrochem. Soc. vol. 136, No. 6, 1989, 1772-1777.*
(Continued)

*Primary Examiner* — Vera Katz
(74) *Attorney, Agent, or Firm* — Morgan, Lewis & Bockius LLP

(57) ABSTRACT

Provided is an Al alloy member with an excellent mechanical strength that is sufficient for use in large-scale manufacturing apparatuses. The Al alloy member is characterized in that, in mass %, Mg concentration is 5.0% or less, Ce concentration is 15% or less, Zr concentration is 0.15% or less, the balance comprises Al and unavoidable impurities, the elements of the unavoidable impurities are respectively 0.01% or less, and the Vickers hardness of the Al alloy member is greater than 30.

10 Claims, 10 Drawing Sheets

(56) References Cited

U.S. PATENT DOCUMENTS

| | | |
|---|---|---|
| 2009/0038946 A1 * | 2/2009 | Ohmi et al. .................. 205/95 |
| 2009/0050485 A1 * | 2/2009 | Wada et al. .................. 205/50 |
| 2009/0324994 A1 | 12/2009 | Kernig et al. |
| 2012/0119216 A1 * | 5/2012 | Ohmi ............................ 257/59 |

FOREIGN PATENT DOCUMENTS

| | | |
|---|---|---|
| JP | 1272739 A * | 10/1989 |
| JP | 9176772 | 7/1997 |
| JP | 2002543289 T | 12/2002 |
| WO | 2006/134737 | 12/2006 |

OTHER PUBLICATIONS

Office Action dated Jun. 9, 2013 in corresponding Chinese Application No. 200980128811.7.

* cited by examiner

AL ALLOY MEMBER, ELECTRONIC DEVICE MANUFACTURING APPARATUS, AND METHOD OF MANUFACTURING AN ANODIC OXIDE FILM COATED AL ALLOY MEMBER

This is a U.S. National Phase Entry of PCT Application No. PCT/JP2009/063415, filed Jul. 28, 2009, with a priority date of Jul. 30, 2008, based upon Japanese Patent Application No. 2008-196036.

TECHNICAL FIELD

This invention relates to an Al (aluminum) alloy member and, in particular, relates to an Al alloy member which is lightweight and excellent in mechanical strength. Further, this invention relates to an electronic device manufacturing apparatus using such an Al alloy member.

BACKGROUND ART

Manufacturing apparatuses for semiconductor devices, flat display panels, and various other electronic devices are normally made of stainless steel. However, in the case of, for example, an apparatus which is adapted to process a large substrate (2.88 m×3.08 m) for manufacturing a large display, since its weight becomes too heavy, it has been studied to use a lightweight metal, for example, an Al alloy. However, in the case of the manufacturing apparatus for such a large substrate, the Al alloy is deformed by its own weight so that an O-ring or the like for maintaining the airtightness does not work. In view of this, an Al alloy which is excellent in strength has been required.

On the other hand, since the inside of manufacturing apparatuses for various electronic devices is exposed to corrosive chemical solutions, corrosive gases, plasmas, and so on, even if the manufacturing apparatus is made of an Al alloy, its inside should be coated with a strong passive protective film. In view of this, an Al alloy which is excellent in strength and whose surface can be coated with a strong passive protective film has been particularly required.

As an Al alloy which can increase the mechanical strength and whose surface can be coated with a strong passive protective film, one shown in Patent Document 1 (JP-A-H9-176772) is known, for example. However, the material disclosed in Patent Document 1 is insufficient in strength for application to recent large-scale manufacturing apparatuses and, further, a passive fluoride film disclosed in Patent Document 1 is insufficient against various corrosive gases • plasmas.

The present inventors have proposed using an Al alloy added with Mg and Zr and anodizing its surface in a non-aqueous solution, thereby obtaining a passive protective film (Patent Document 2: International Publication WO2006/134737 Pamphlet). However, the material disclosed in Patent Document 2 is insufficient in strength for application to recent large-scale manufacturing apparatuses and, further, the anodic oxide film disclosed in Patent Document 2 is also insufficient in corrosion resistance to a chlorine gas.

Patent Document 3 (JP-A-H1-272739) describes a coloring aluminum alloy added with/containing coloring elements, but there is no disclosure of obtaining a high-hardness member with a Vickers hardness greater than 30, which is made of a high-purity Al alloy added with/containing only elements adapted to increase the hardness of the aluminum alloy, i.e. with extremely low contents of unavoidable impurities. An aluminum alloy of sample No. 8 in Table 1 shown as an Example in Patent Document 3 (JP-A-H1-272739) contains not only Ce, Mg, and Zr, but also 4.90 wt % Zn as coloring elements.

PRIOR ART DOCUMENT

Patent Document

Patent Document 1: JP-A-H9-176772
Patent Document 2: International Publication WO2006/134737 Pamphlet
Patent Document 3: JP-A-H1-272739

SUMMARY OF THE INVENTION

Problem to be Solved by the Invention

Therefore, it is an object of this invention to provide an Al alloy member which is excellent in mechanical strength so as to be usable in a large-scale manufacturing apparatus.

Further, it is an object of this invention to provide an Al alloy member having a surface at least a portion of which is coated with an anodic oxide film excellent in corrosion resistance.

Further, it is an object of this invention to provide an electronic device manufacturing apparatus at least a portion of which uses the above-mentioned Al alloy member.

Further, it is an object of this invention to provide a method of manufacturing an anodic oxide film coated Al alloy member having a surface at least a portion of which is coated with an anodic oxide film excellent in corrosion resistance.

Means for Solving the Problem

An Al alloy member according to this invention, an electronic device manufacturing apparatus in which at least a portion thereof uses the Al alloy member, and an anodic oxide film coated Al alloy member manufacturing method are as follows.

(1) An Al alloy member characterized in that, in mass %, a Mg concentration is 5.0% or less, a Ce concentration is 15% or less, a Zr concentration is 0.15% or less, the balance comprises Al and unavoidable impurities, elements of the unavoidable impurities are respectively 0.01% or less, and a Vickers hardness of the Al alloy member is greater than 30.

(2) An Al alloy member characterized in that, in mass %, a Mg concentration is more than 0.01% and 5.0% or less, a Ce concentration is more than 0.01% and 5.0% or less, a Zr concentration is more than 0.01% and 0.15% or less, the balance comprises Al and unavoidable impurities, elements of the unavoidable impurities are respectively 0.01% or less, and a Vickers hardness of the Al alloy member is greater than 30.

(3) The Al alloy member according to the above-mentioned (1) or (2), characterized in that at least a portion of its surface is coated with an anodic oxide film by a non-aqueous solution.

(4) The Al alloy member according to the above-mentioned (3), characterized in that the anodic oxide film by the non-aqueous solution has a thickness of 0.1 μm to 0.6 μm.

(5) The Al alloy member according to the above-mentioned (3) or (4), characterized in that the anodic oxide film by the non-aqueous solution is an amorphous $Al_2O_3$ film.

(6) An electronic device manufacturing apparatus characterized in that at least a portion of its container or its substrate mounting stage uses the Al alloy member according to one of the above-mentioned (1) to (5).

(7) An anodic oxide film coated Al alloy member manufacturing method characterized by comprising a step of obtaining an Al alloy member with a Vickers hardness greater than 30, wherein, in mass %, a Mg concentration is 5.0% or less, a Ce concentration is 15% or less, a Zr concentration is 0.15% or less, the balance comprises Al and unavoidable impurities, and elements of the unavoidable impurities are respectively 0.01% or less, and a step of coating at least a portion of a surface of the Al alloy member with an anodic oxide film by a non-aqueous solution.

(8) An anodic oxide film coated Al alloy member manufacturing method characterized by comprising a step of obtaining an Al alloy member with a Vickers hardness greater than 30, wherein, in mass %, a Mg concentration is more than 0.01% and 5.0% or less, a Ce concentration is more than 0.01% and 5.0% or less, a Zr concentration is more than 0.01% and 0.15% or less, the balance comprises Al and unavoidable impurities, and elements of the unavoidable impurities are respectively 0.01% or less, and a step of coating at least a portion of a surface of the Al alloy member with an anodic oxide film by a non-aqueous solution.

(9) The anodic oxide film coated Al alloy member manufacturing method according to the above-mentioned (7) or (8), characterized in that the anodic oxide film by the non-aqueous solution has a thickness of 0.1 μm to 0.6 μm.

(10) The anodic oxide film coated Al alloy member manufacturing method according to one of the above-mentioned (7) to (9), characterized in that the anodic oxide film by the non-aqueous solution is an amorphous $Al_2O_3$ film.

It is noted that "anodization in a non-aqueous solution" referred to in this application represents the anodization disclosed in Patent Document 2 and "an anodic oxide film by a non-aqueous solution" referred to in this application represents an anodic oxide film obtained by "anodization in a non-aqueous solution" and having properties such that the corrosion resistance is excellent and that the amount of water release during use is small.

Effect of the Invention

According to this invention, there is obtained an Al alloy member which is excellent in mechanical strength so as to be usable in a large-scale manufacturing apparatus.

Further, according to this invention, there is obtained an Al alloy member having a surface at least a portion of which is coated with an anodic oxide film by a non-aqueous solution excellent in corrosion resistance.

Further, according to this invention, there is obtained an electronic device manufacturing apparatus at least a portion of which uses the above-mentioned Al alloy member.

Further, according to this invention, there is obtained a method of manufacturing an anodic oxide film coated Al alloy member having a surface at least a portion of which is coated with an anodic oxide film by a non-aqueous solution excellent in corrosion resistance.

MODE FOR CARRYING OUT THE INVENTION

Hereinbelow, Al alloy members according to an embodiment of this invention will be described with reference to the drawings.

The Al alloy member according to the embodiment of this invention is an Al—Mg—Zr—Ce alloy in which, in mass %, the Mg concentration is 5.0% or less, the Ce concentration is 15% or less, the Zr concentration is 0.15% or less, the balance comprises Al and unavoidable impurities, and elements of the unavoidable impurities are respectively 0.01% or less. In this embodiment, the elements of the unavoidable impurities are mainly Si, Fe, and Cu and, in addition, Mn, Cr, Zn, and so on are unavoidably mixed from material ingots, scraps, tools, and so on when casting the alloy. In order to obtain the alloy of such purity, it is preferable to carry out casting using, for example, ingots of high-purity Al with an Al purity of 99.98 mass % or more obtained by the segregation process, the trinal electrolytic process, or the like.

Preferably, the Al alloy member according to this embodiment is such that, in mass %, the Mg concentration is more than 0.01% and 5.0% or less, the Ce concentration is more than 0.01% and 5.0% or less, the Zr concentration is more than 0.01% and 0.15% or less, the balance comprises Al and unavoidable impurities, and elements of the unavoidable impurities are respectively 0.01% or less. Also in this preferable example, the elements of the unavoidable impurities are, for example, Si, Fe, Cu, and so on. These impurities are normally mixed in a general-purpose Al alloy in an amount of about 0.several %, but since this causes a bad influence such as impairing the uniformity of a coating film formed by anodization, the impurities should be 0.01% or less.

The critical significance of the numerical limitations in the Al alloy member according to this embodiment will be described with reference to FIGS. 1 and 2.

Figure 1:
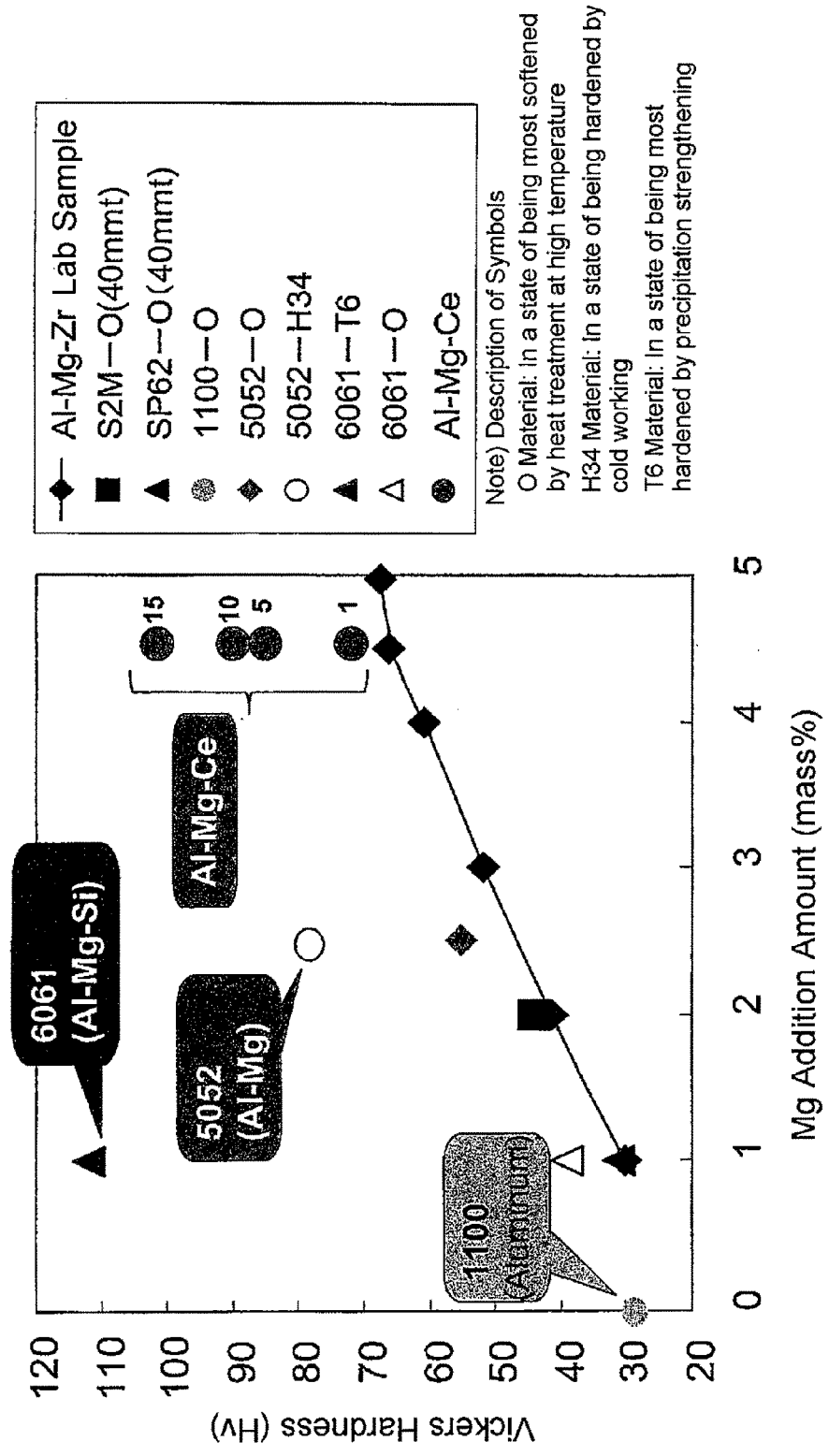
FIG. 1 is a graph for explaining the critical significance of numerical limitations in an Al alloy member according to an embodiment of this invention and is the graph showing the relationship between the Mg concentration in an Al alloy and the hardness thereof (room temperature).

In FIG. 1, as is clear from the Vickers hardness of six Al—Mg—Zr samples with Mg addition amounts (mass %) of 1%, 2%, 3%, 4%, 4.5%, and 5%, the mechanical strength is improved with the addition of 5.0% or less Mg. In the two Al—Mg—Zr samples with the Mg addition amounts of 4.5% and 5%, the Vickers hardness is improved twice or more from 30 to about 68 as compared with aluminum indicated by "1100".

In FIG. 1, four Al—Mg—Ce samples plotted above the Al—Mg—Zr sample with the Mg addition amount of 4.5% are samples obtained by adding Ce in amounts of, in mass %, 1%, 5%, 10%, and 15% to Al—Mg—Zr samples with the Mg addition amount of 4.5%. These four Al—Mg—Ce samples are higher in Vickers hardness than the Al—Mg—Zr sample with the Mg addition amount of 4.5%.

Figure 2:
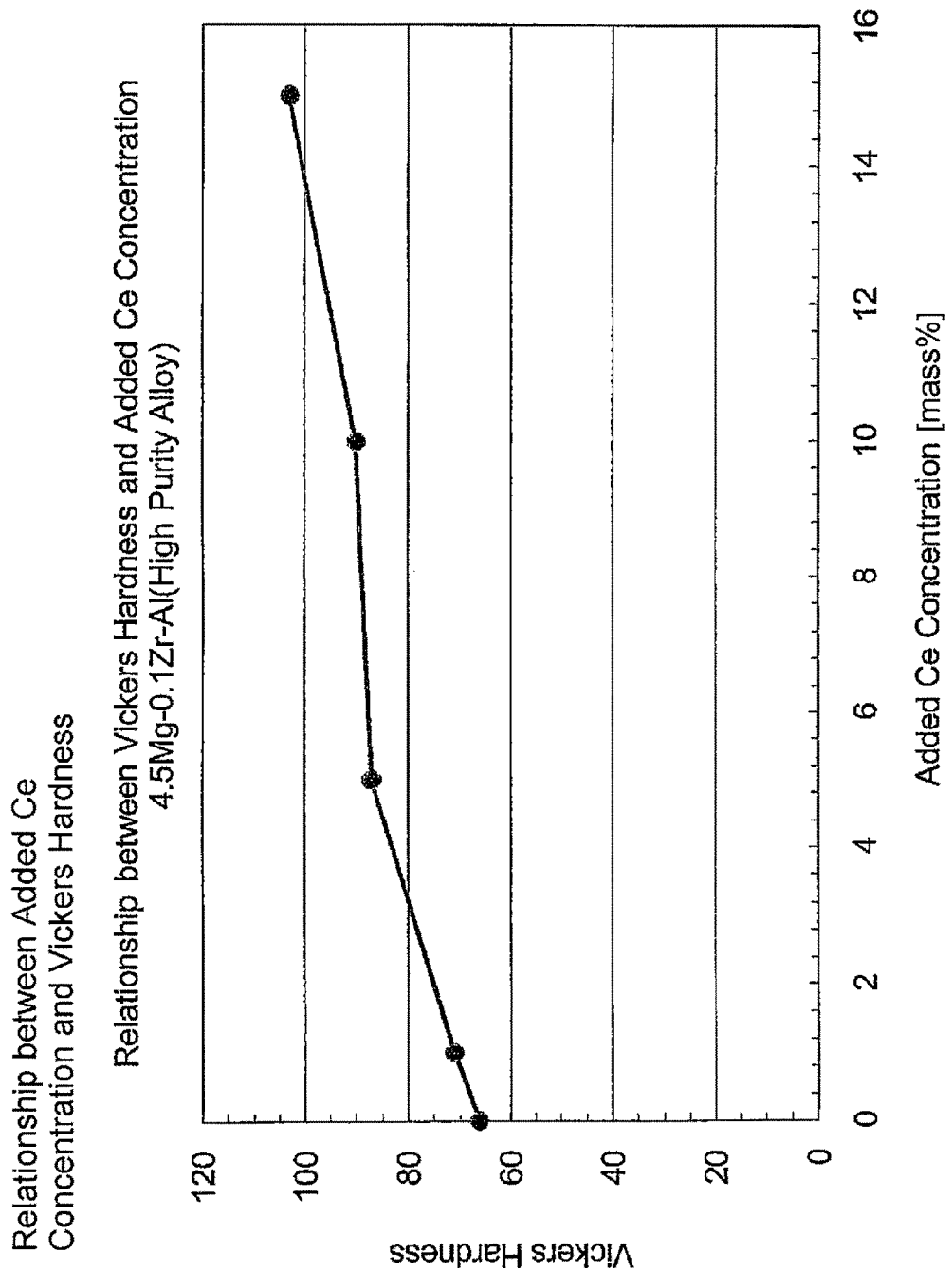
FIG. 2 is a graph for explaining the critical significance of the numerical limitations in the Al alloy member according to the embodiment and is the graph showing the relationship between the added Ce concentration and the Vickers hardness.

FIG. 2 shows the relationship between the Ce concentration (mass %) added to an Al alloy sample with a Mg addition amount of 4.5% and a Zr addition amount of 0.1% and the Vickers hardness thereof. As is clear from FIG. 2, the Vickers hardness exceeds 68 and is improved to about 105 by adding Ce up to about 15.0%.

By adding about 0.15% or less Zr, the grain growth is suppressed even if a heat treatment is carried out at about 350° C. so that the mechanical strength is maintained.

Figure 3:
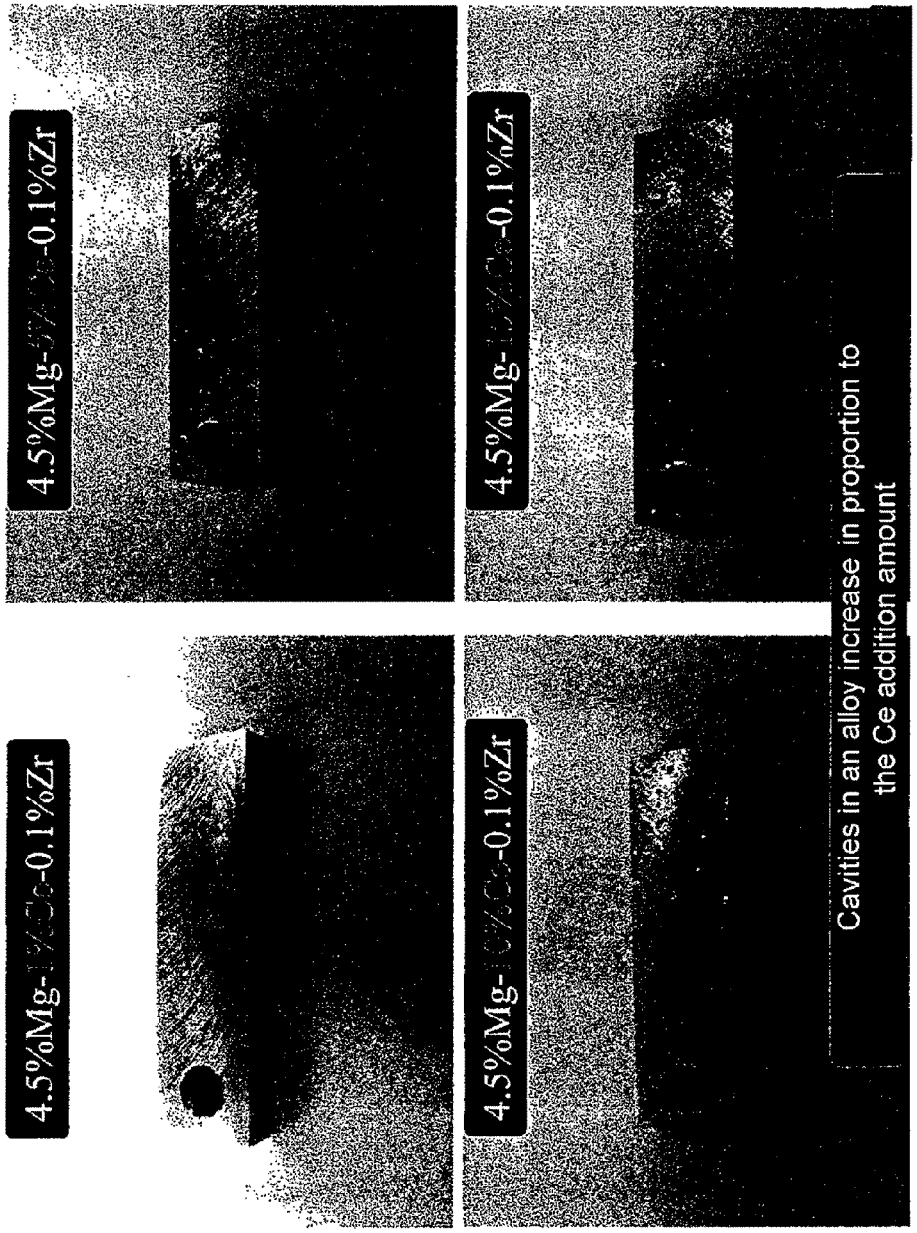
FIG. 3 is photographs showing the external appearance, after machining, of Ce-added Al alloys (Al alloy members according to the embodiment).

Photographs of FIG. 3 show the external appearance, after machining, of the Al alloy members according to the above-mentioned embodiment.

Figure 4:
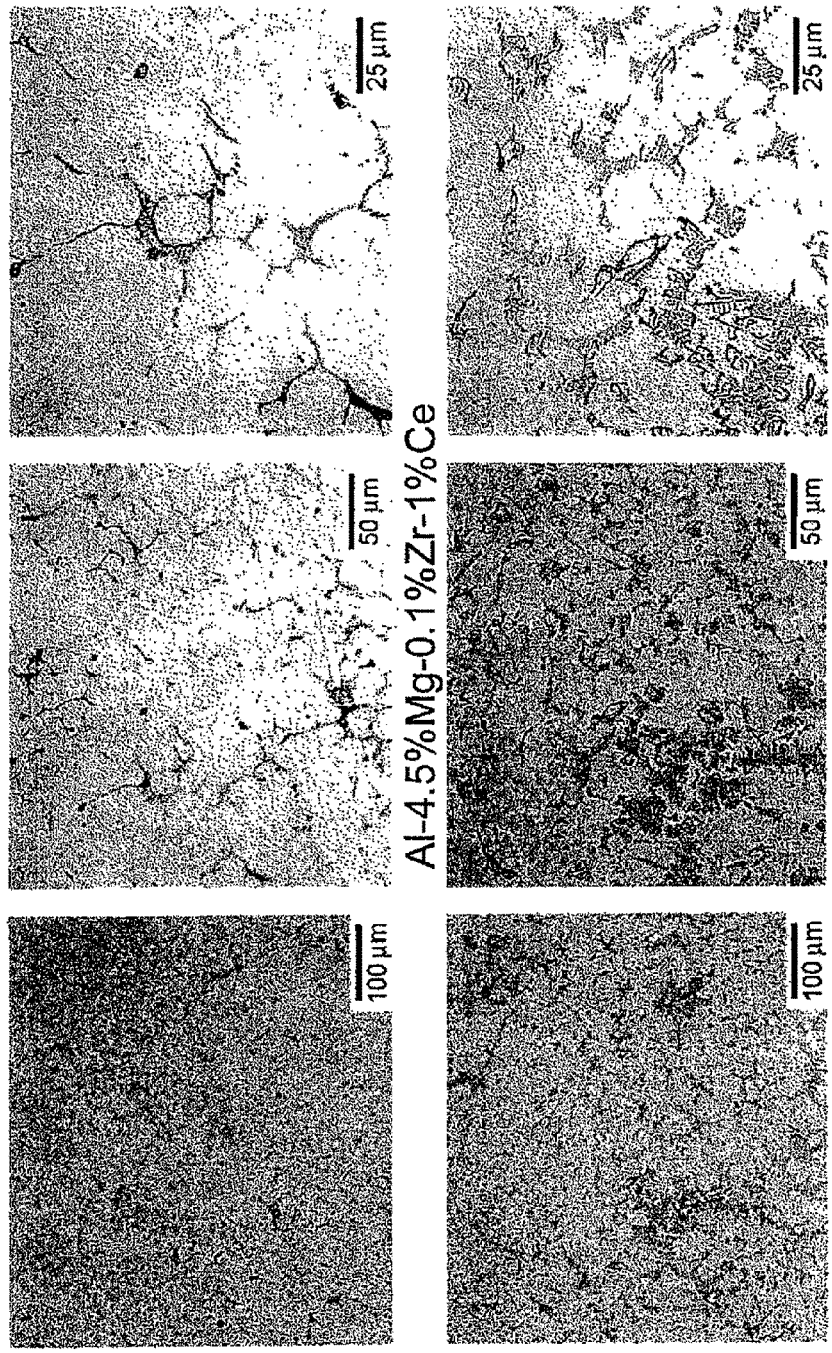
FIG. 4 is photographs showing microstructure surfaces of Al—Mg—Zr—Ce alloys (as-cast) and is the photographs showing the surfaces of the Al alloy members according to the embodiment.
Figure 5:
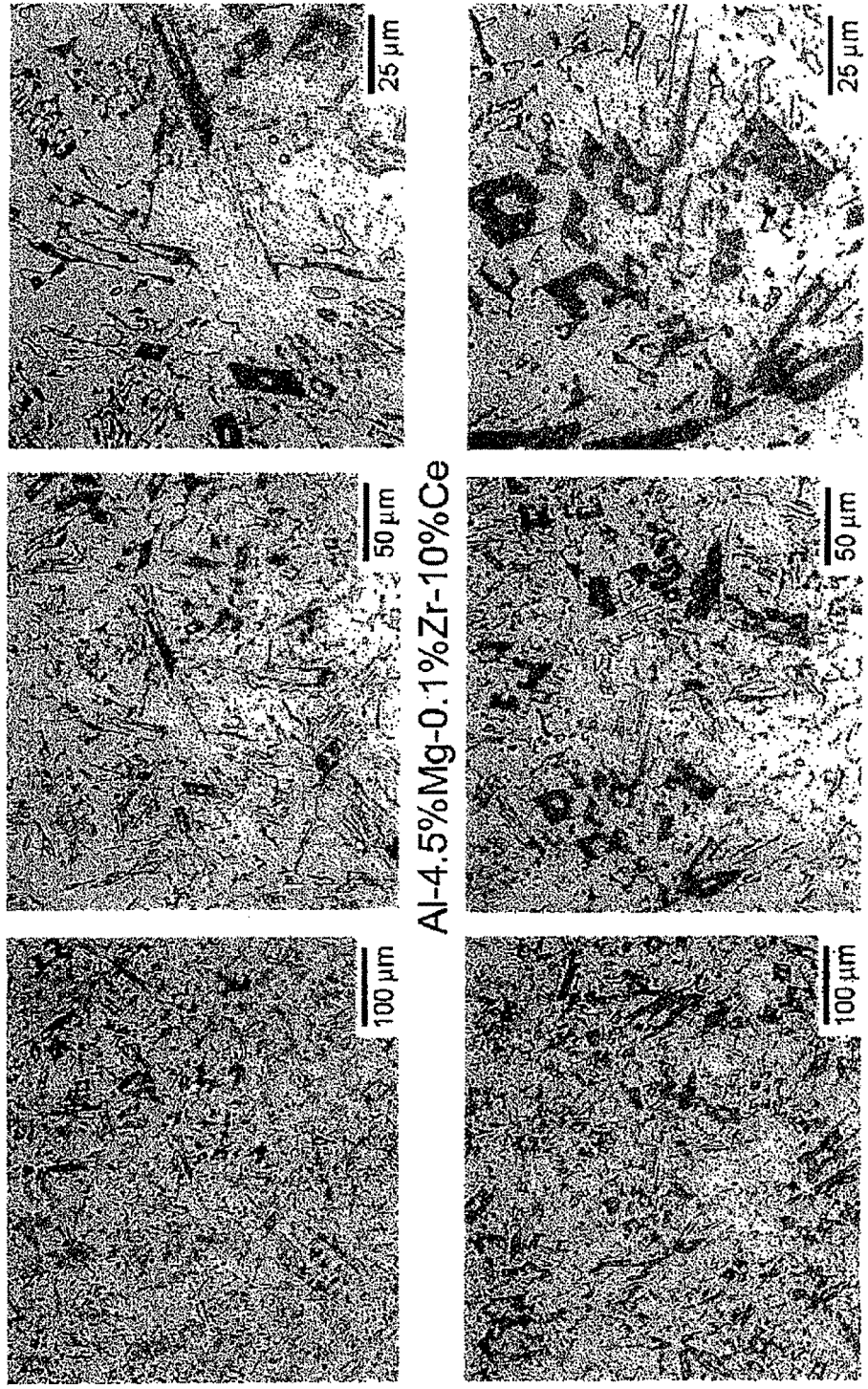
FIG. 5 is photographs showing microstructure surfaces of Al—Mg—Zr—Ce alloys (as-cast) and is the photographs showing the surfaces of the Al alloy members according to the embodiment.

Photographs of FIGS. 4 and 5 show microstructure surfaces of the Al alloy members (as-cast) according to the above-mentioned embodiment.

As is clear from FIG. 3, if the Ce addition amount exceeds 5.0% (see the lower-left photograph and the lower-right photograph in FIG. 3), "cavities" (voids) are formed in the member and, therefore, the Ce addition amount is preferably 5.0% or less (see the upper-left photograph and the upper-right photograph in FIG. 3). Even with the addition of 5.0% Ce, the Vickers hardness is improved to about 88 (FIGS. 1 and 2).

Even if the Ce addition amount exceeds 5.0% so that the "cavities" (voids) are formed in the member, by carrying out a treatment of applying 500 to 1800 atmospheric pressure to the member in a high-purity Ar gas atmosphere (HIP (Hot Isostatic Pressing) treatment) while heating it to about 350° C., it is possible to obtain a member with no "cavities" (voids).

Figure 6:
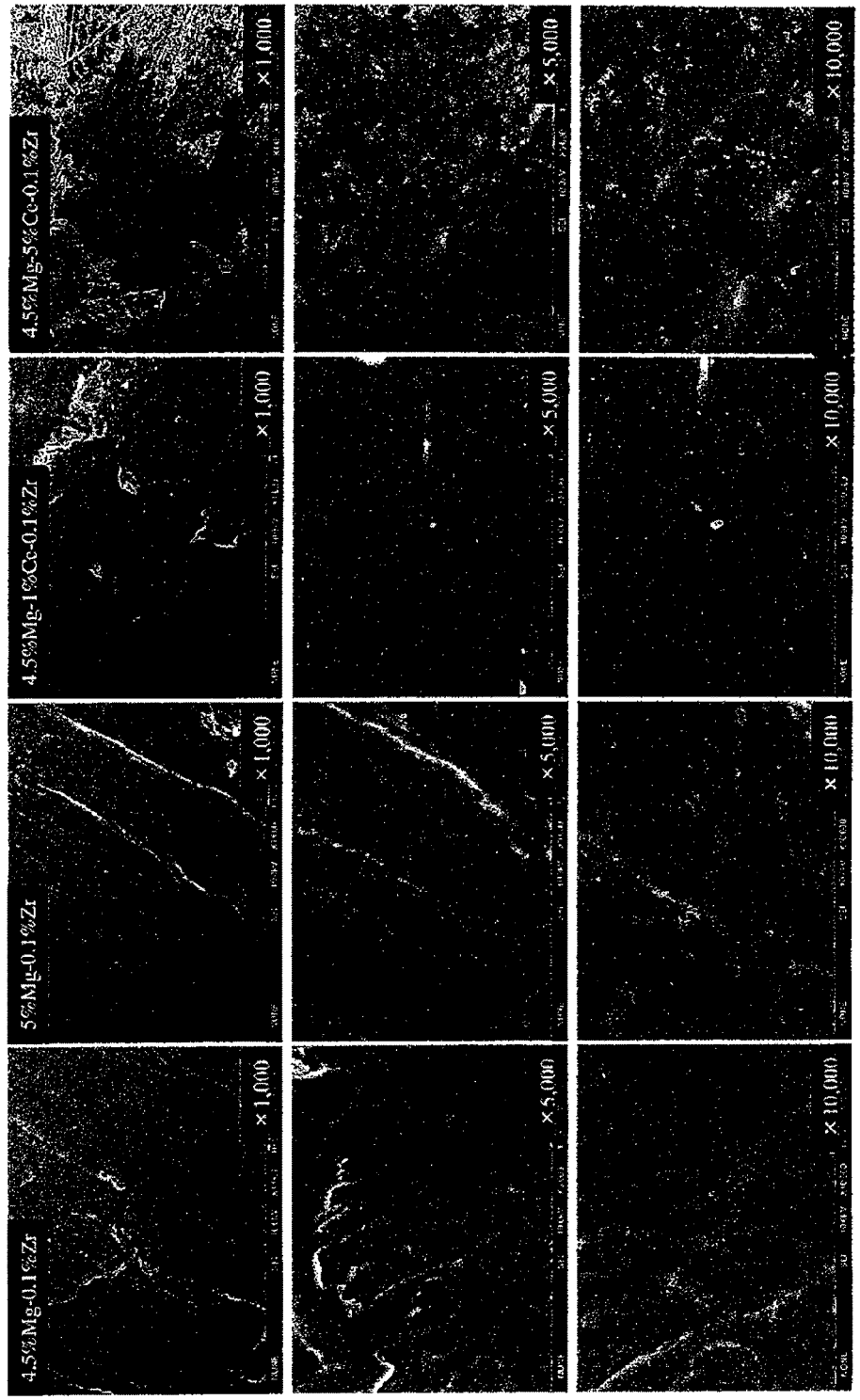
FIG. 6 is photographs taken by a scanning electron microscope for observing surfaces of anodic oxide films by a non-aqueous solution formed on surfaces of Ce-added Al alloy members (Al alloy members according to the embodiment) and Ce-free Al alloy members, wherein the photographs on right two columns are photographs of the anodic oxide films by the non-aqueous solution on the surfaces of the Ce-added Al alloy members (Al alloy members according to the embodiment) and the photographs on left two columns are photographs of the anodic oxide films on the surfaces of the Ce-free Al alloy members.

On the surface of the Ce-added Al alloy member thus obtained, an amorphous $Al_2O_3$ film is formed to about 0.1 μm to 0.6 μm as an anodic oxide film by anodization using a non-aqueous solution. The non-aqueous solution used contains ethylene glycol or diethylene glycol as a solvent and contains pure water and adipic acid as solutes. If the thickness of the anodic oxide film is less than 0.1 μm, the effect is small, while, even if it exceeds 0.6 μm, no significant effect is obtained, thus being economically disadvantageous. Right two columns of FIG. 6 show scanning electron microscope photographs of anodic oxide films formed on the surfaces of the Ce-added Al alloy members and left two columns of FIG. 6 show scanning electron microscope photographs of anodic oxide films formed on the surfaces of the Ce-free Al alloy members.

Herein, non-aqueous solutions usable in this invention will be described below. The non-aqueous solution for use in this invention contains a non-aqueous solvent. When the non-aqueous solution containing the non-aqueous solvent is used, the time required for constant-current anodization can be shortened as compared with using an aqueous solution based anodizing solution and thus there is an advantage of being capable of processing with high throughput.

Non-aqueous solutions disclosed in Patent Document 2, which will be described hereinbelow, can also be used in this invention.

While the kinds of non-aqueous solvents are not particularly limited as long as it can well achieve anodization and has sufficient solubility for a solute, a solvent having one or more alcoholic hydroxyl groups and/or one or more phenolic hydroxyl groups or an aprotic organic solvent is preferable. Among them, the solvent having the alcoholic hydroxyl group/groups is preferable in view of preservation stability.

As a compound having an alcoholic hydroxyl group/groups, use can be made of, for example, monohydric alcohol such as methanol, ethanol, propanol, isopropanol, 1-butanol, 2-ethyl-1-hexanol, or cyclohexanol, dihydric alcohol such as ethylene glycol, propylene glycol, butane-1,4-diol, diethylene glycol, triethylene glycol, or tetraethylene glycol, trihydric or more polyhydric alcohol such as glycerin or pentaerythritol, or the like. A solvent having a functional group/groups other than an alcoholic hydroxyl group/groups in a molecule can also be used as long as it does not impair the expected effect of this invention. Among them, such a compound having two or more alcoholic hydroxyl groups is preferable in terms of miscibility with water and vapor pressure, dihydric alcohol or trihydric alcohol is more preferable, and ethylene glycol, propylene glycol, or diethylene glycol is particularly preferable.

As a compound having a phenolic hydroxyl group/groups, use can be made of, for example, alkylphenol such as unsubstituted phenol, o-/m-/p-cresol, or xylenol having one hydroxyl group, resorcinol having two hydroxyl groups, pyrogallol having three hydroxyl groups, or the like.

These compounds having the alcoholic hydroxyl group/groups and/or the phenolic hydroxyl group/groups may further have another functional group/groups in a molecule as long as the expected effect of this invention is not impaired. For example, use can be made of a solvent having an alcoholic hydroxyl group and an alkoxy group, such as methyl cellosolve or cellosolve.

As an aprotic organic solvent, use may be made of either of a polar solvent and a nonpolar solvent.

As polar solvents, although not particularly limited, there are cited, for example, cyclic carboxylic acid esters such as γ-butyrolactone, γ-valerolactone, and δ-valerolactone, chain carboxylic acid esters such as methyl acetate, ethyl acetate, and methyl propionic acid, cyclic carbonate esters such as ethylene carbonate, propylene carbonate, butylene carbonate, and vinylene carbonate, chain carbonate esters such as dimethyl carbonate, ethyl methyl carbonate, and diethyl carbonate, amides such as N-methylformamide, N-ethylformamide, N,N-dimethylformamide, N,N-diethylformamide, N-methylacetamide, N,N-dimethylacetamide, and N-methylpyrrolidone, nitriles such as acetonitrile, glutaronitrile, adiponitrile, methoxyacetonitrile, and 3-methoxypropionitrile, and phosphoric acid esters such as trimethyl phosphate and triethyl phosphate.

As nonpolar solvents, although not particularly limited, there are cited, for example, hexane, toluene, silicone oil, and so on.

These solvents may be used alone or in combination of two or more kinds. As a non-aqueous solvent of a non-aqueous solution for use in forming an anodic oxide film of this invention, ethylene glycol, propylene glycol, or diethylene glycol is particularly preferable and these may be used alone or in combination thereof. Water may be contained as long as the non-aqueous solvent is contained.

Figure 7:
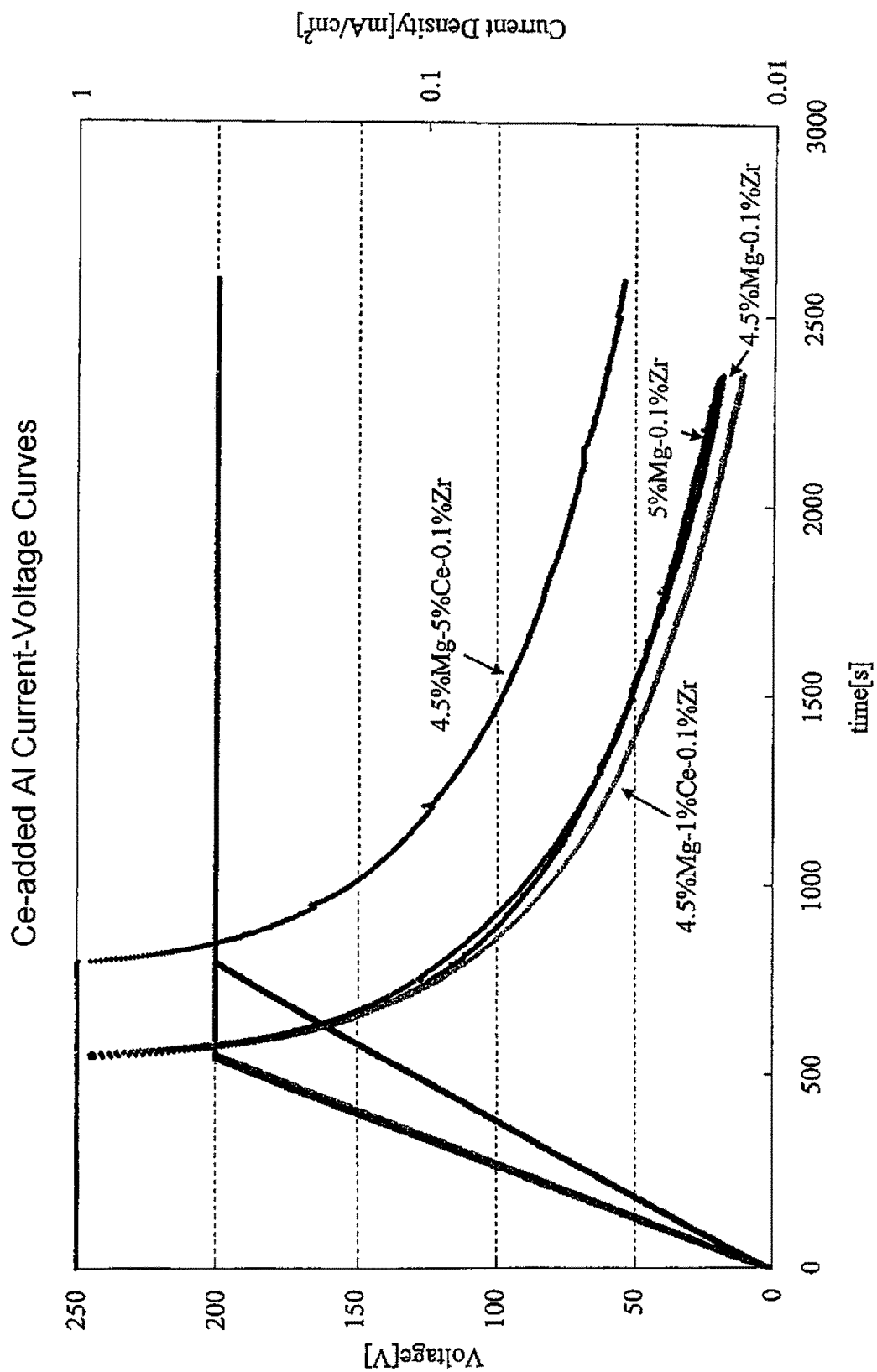
FIG. 7 is a graph showing the temporal characteristics of the voltage and current when obtaining the anodic oxide films by anodization using the non-aqueous solution on the surfaces of the Ce-added Al alloy members (Al alloy members according to the embodiment) and the Ce-free Al alloy members.

FIG. 7 shows the temporal characteristics of the anodization voltage and the anodization current when obtaining anodic oxide films by anodization using the above-mentioned non-aqueous solution. FIG. 7 shows the temporal characteristics of the voltage and the current density when constant-current anodization is carried out for a Ce-added Al alloy member (4.5% Mg-1% Ce-0.1% Zr), a Ce-free Al alloy member (4.5% Mg-0.1% Zr), another Ce-free Al alloy member (5% Mg-0.1% Zr), and another Ce-added Al alloy member (4.5% Mg-5% Ce-0.1% Zr) at a current density of 1 mA/cm$^2$ until the voltage reaches 200V and then, continuously, constant-voltage anodization is carried out while maintaining the voltage at 200V.

As shown in FIG. 7, in the case where the anodic oxide film is formed on the surface of the Ce-added Al alloy member (4.5% Mg-1% Ce-0.1% Zr), as compared with the case where the anodic oxide film is formed on the surface of the Ce-free Al alloy member (4.5% Mg-0.1% Zr), the current density decreases when the elapsed time exceeds about 600 seconds so that the anodization characteristics (graph of change in anodization current with respect to the time) are improved. Further, in the case where the anodic oxide film is formed on the surface of the Ce-added Al alloy member (4.5% Mg-1% Ce-0.1% Zr), even as compared with the case where the anodic oxide film is formed on the surface of the other Ce-free Al alloy member (5% Mg-0.1% Zr), the anodization current decreases when the elapsed time exceeds about 750 seconds so that the anodization characteristics are improved.

Further, in the case where the anodic oxide film is formed on the surface of the Ce-added Al alloy member (4.5% Mg-1% Ce-0.1% Zr), the anodization current can be smaller as compared with the case where the anodic oxide film is formed on the surface of the other Ce-added Al alloy member (4.5% Mg-5% Ce-0.1% Zr). This is because the surface to be anodized is flatter (with less "cavities" (voids)) in the Ce-added Al alloy member (4.5% Mg-1% Ce-0.1% Zr) than in the other Ce-added Al alloy member (4.5% Mg-5% Ce-0.1% Zr).

Figure 8:
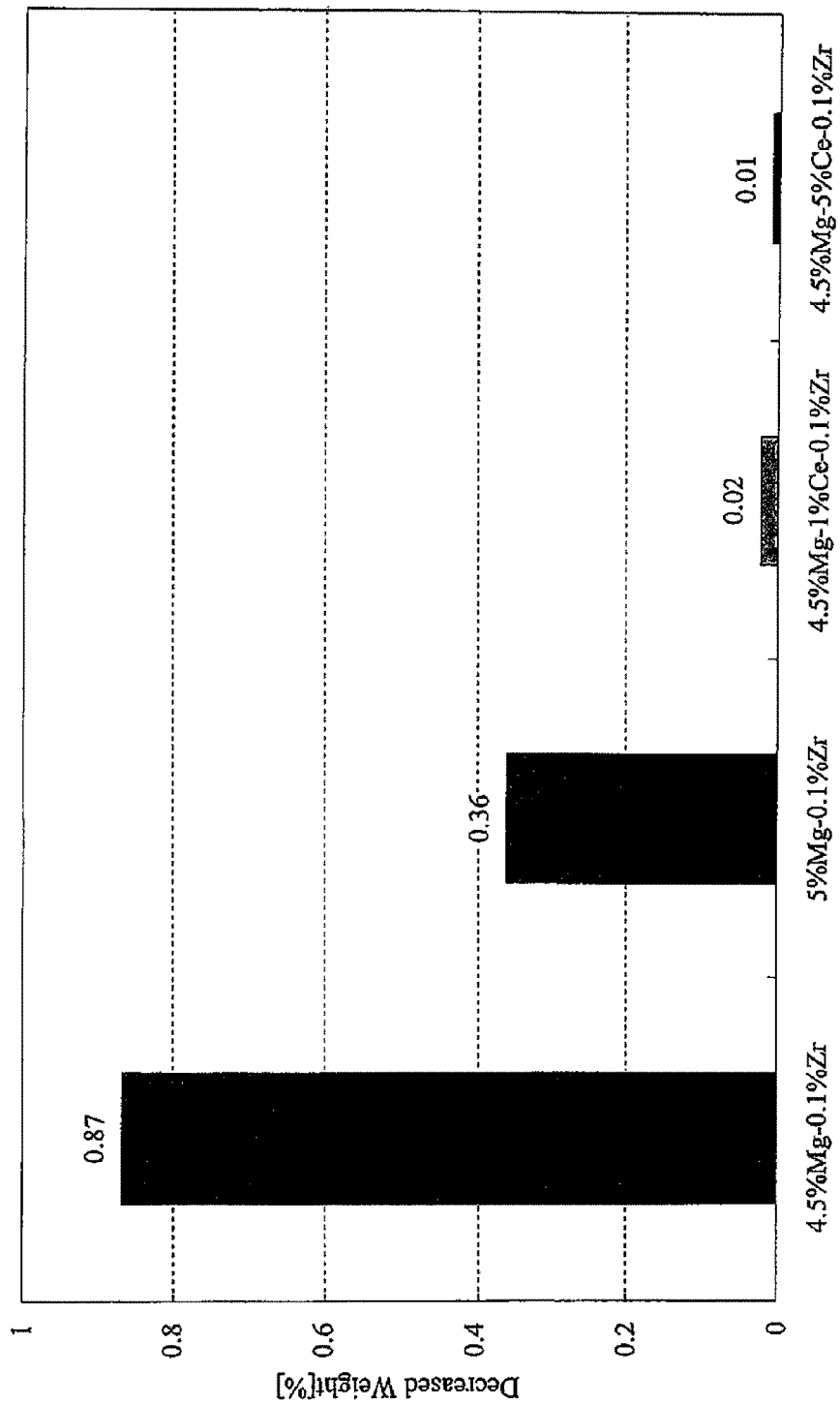
FIG. 8 is a graph showing the resistance of the anodic oxide films on the surfaces of the Ce-added Al alloy members (Al alloy members according to the embodiment) and the Ce-free Al alloy members when the anodic oxide films are exposed to a chlorine gas ($Cl_2$ gas).

FIG. 8 shows the resistance of the above-mentioned anodic oxide films when exposed to a chlorine gas ($Cl_2$ gas). As shown in FIG. 8, the anodic oxide films formed on the surfaces of the Ce-added Al alloy member (4.5% Mg-1% Ce-0.1% Zr) and the other Ce-added Al alloy member (4.5% Mg-5% Ce-0.1% Zr) are significantly improved in corrosion resistance to the chlorine gas as compared with the anodic oxide films formed on the surfaces of the Ce-free Al alloy member (4.5% Mg-0.1% Zr) and the other Ce-free Al alloy member (5% Mg-0.1% Zr).

The decreased weight due to corrosion becomes 0.02% or less from 0.87% in the anodic oxide films formed on the surfaces of the Ce-added Al alloy member (4.5% Mg-1% Ce-0.1% Zr) and the other Ce-added Al alloy member (4.5% Mg-5% Ce-0.1% Zr) as compared with the anodic oxide film formed on the surface of the Ce-free Al alloy member (4.5% Mg-0.1% Zr). In the anodic oxide film formed on the surface of the other Ce-added Al alloy member (4.5% Mg-5% Ce-0.1% Zr), the decreased weight due to corrosion is 0.01%.

Figure 9:
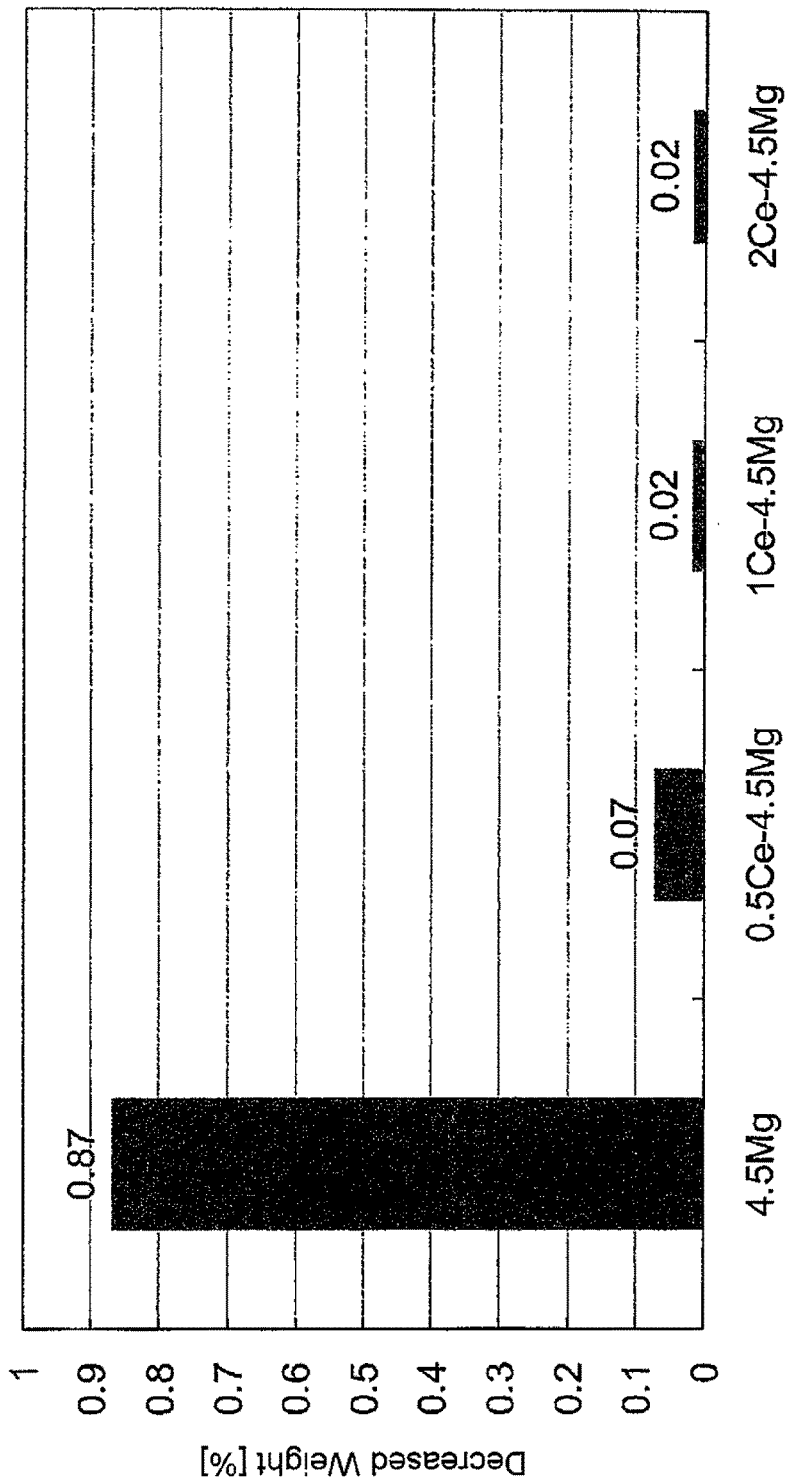
FIG. 9 is another graph showing the resistance of anodic oxide films on surfaces of Ce-added Al alloy members (Al alloy members according to the embodiment) and a Ce-free Al alloy member when the anodic oxide films are exposed to a chlorine gas ($Cl_2$ gas).

FIG. 9 is a graph showing the resistance of anodic oxide films formed on surfaces of test pieces in which the Ce concentrations of Ce-added Al alloys are set to 0.5%, 1%, and 2% and Mg and Zr being the other additive elements are set to 4.5% and 0.1%, respectively, when the anodic oxide films are exposed to a chlorine gas ($Cl_2$ gas). As shown in FIG. 9, it is confirmed that the corrosion resistance to the chlorine gas is degraded as the Ce addition amount is decreased to 0.5%. It is confirmed that the corrosion resistance is improved as the Ce concentration is increased such that the decreased weight is 0.07% when the Ce concentration is 0.5%, the decreased weight is 0.02% when the Ce concentration is 1%, and the decreased weight is 0.02% when the Ce concentration is 2%. As compared with the Al alloy member (4.5% Mg-0.1% Zr) added with no Ce, the corrosion resistance improving effect is exhibited by adding Ce, but the Ce addition amount is preferably 1% or more.

In FIGS. 8 and 9, the ordinate axis represents $$\{(\text{initial weight}-\text{weight after exposure})/\text{initial weight}\}\times 100(\%)$$

which is calculated based on the initial weight of a test piece when exposed to a chlorine gas and the weight after the exposure.

Figure 10:
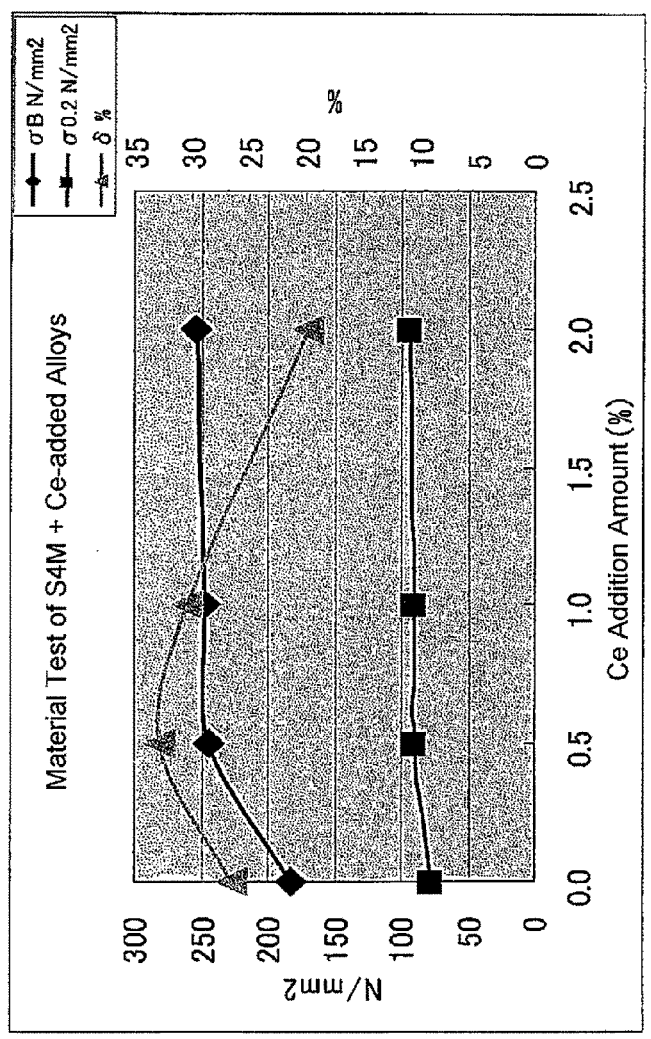
FIG. 10 is a graph showing the tensile strength, the 0.2% proof stress, and the elongation of the Ce-added Al alloy members (Al alloy members according to the embodiment) and the Ce-free Al alloy member (S4M).

FIG. 10 is a graph showing the tensile strength, the 0.2% proof stress, and the elongation of Ce-added Al alloys. The abscissa axis represents the Ce addition amount [%] to a 4.5% Mg-0.1% Zr—Al alloy (S4M), the left ordinate axis represents the tensile strength [N/mm$^2$] and the 0.2% proof stress [N/mm$^2$], and the right ordinate axis represents the elongation [%]. It is confirmed that values of the tensile strength and the 0.2% proof stress are increased by adding Ce. It is seen that these numerical values are increased in relation to the Ce addition amount. On the other hand, it is confirmed that the elongation is decreased from a maximum value at the Ce addition concentration of 0.5%. In terms of the rolling performance, the Ce concentration is preferably not so high and it is considered that the Ce addition amount is preferably less than 2%.

It is sufficient that the Ce-added Al alloy member is coated with the anodic oxide film by the non-aqueous solution at least at a portion (portion which is brought into contact with a corrosive gas or chemical solution) of the surface thereof.

The Ce-added Al alloy member or the Ce-added Al alloy member formed with the anodic oxide film at least at a portion of the surface thereof can be used at least at a portion of a container or a substrate mounting stage of an electronic device manufacturing apparatus.

While the invention of this application has been described with reference to the embodiment, the invention of this application is not limited to the above-mentioned embodiment.

The invention claimed is:

1. An Al alloy member for an electronic device manufacturing apparatus consisting of, in mass %, a Mg concentration of more than 0.01% and 5.0% or less, a Ce concentration of more than 0.5% and 2% or less, a Zr concentration of more than 0.01% and 0.15% or less, Al and unavoidable impurities, wherein elements of the unavoidable impurities are respectively 0.01% or less, a Vickers hardness of the Al alloy member is greater than 30, and wherein at least a portion of a surface of the Al alloy member is coated with an anodic oxide film by a non-aqueous solution, and wherein the anodic oxide film has a decreased weight due to corrosion in a chlorine environment of 0.07% of less.

2. An Al alloy member for an electronic device manufacturing apparatus consisting of, in mass %, a Mg concentration of more than 0.01% and 5.0% or less, a Ce concentration of more than 1% and 2% or less, a Zr concentration of more than 0.01% and 0.15% or less, Al and unavoidable impurities, elements of the unavoidable impurities are respectively 0.01% or less, and wherein at least a portion of a surface of the Al alloy member is coated with an anodic oxide film by a non-aqueous solution, and a Vickers hardness of the Al alloy member is greater than 30, and wherein the anodic oxide film has a decreased weight due to corrosion in a chlorine environment of 0.07% of less.

3. The Al alloy member for an electronic device manufacturing apparatus according to claim 1, wherein the anodic oxide film by the non-aqueous solution has a thickness of 0.1 μm to 0.6 μm.

4. The Al alloy member for an electronic device manufacturing apparatus according to claim 1, wherein the anodic oxide film coated by the non-aqueous solution is an amorphous $Al_2O_3$ film.

5. An electronic device manufacturing apparatus comprising a container and a substrate mounting stage, wherein at least a surface of the container or a surface of the substrate mounting stage comprises the Al alloy member for an electronic device manufacturing apparatus according to one of claims 1 to 2 and 3 to 4.

6. The Al alloy member for an electronic device manufacturing apparatus according to claim 2, wherein the anodic oxide film coated by the non-aqueous solution has a thickness of 0.1 μm to 0.6 μm.

7. The Al alloy member for an electronic device manufacturing apparatus according to claim 2, wherein the anodic oxide film coated by the non-aqueous solution is an amorphous $Al_2O_3$ film.

8. An electronic device manufacturing apparatus comprising a container and a substrate mounting stage, wherein at least a surface of the container or a surface of the substrate mounting stage comprises the Al alloy member for an electronic device manufacturing apparatus according to one of claims 2, 6 and 7.

9. The Al alloy member for an electronic device manufacturing apparatus according to claim 6, wherein the anodic oxide film coated by the non-aqueous solution is an amorphous $Al_2O_3$ film.

10. An electronic device manufacturing apparatus comprising a container and a substrate mounting stage, wherein at least a surface of the container or a surface of the substrate mounting stage comprises the Al alloy member for an electronic device manufacturing apparatus according to claim 9.

* * * * *